(12) United States Patent
Doyle

(10) Patent No.: US 8,739,699 B2
(45) Date of Patent: Jun. 3, 2014

(54) COMBINATION STENCIL PRINTER AND DISPENSER AND RELATED METHODS

(75) Inventor: Dennis G. Doyle, Shrewsbury, MA (US)

(73) Assignee: Illinois Tool Works Inc., Glenview, IL (US)

( * ) Notice: Subject to any disclaimer, the term of this patent is extended or adjusted under 35 U.S.C. 154(b) by 378 days.

(21) Appl. No.: 12/963,453

(22) Filed: Dec. 8, 2010

(65) Prior Publication Data

US 2012/0145014 A1     Jun. 14, 2012

(51) Int. Cl.
   *B05C 17/04*    (2006.01)

(52) U.S. Cl.
   USPC ........................................ 101/123; 101/126

(58) Field of Classification Search
   USPC .......... 101/114, 123, 124, 126, 129, 423, 425
   See application file for complete search history.

(56) References Cited

U.S. PATENT DOCUMENTS

| | | | |
|---|---|---|---|
| 5,176,078 A * | 1/1993 | Homma et al. | 101/126 |
| 5,709,905 A * | 1/1998 | Shaw et al. | 427/8 |
| 6,036,787 A | 3/2000 | Bennett et al. | |
| 6,820,545 B2 | 11/2004 | Yamasaki et al. | |
| 6,999,835 B2 | 2/2006 | Kodama | |
| 7,013,802 B2 | 3/2006 | Marszalkowski, Jr. | |
| 7,017,489 B2 | 3/2006 | Perault et al. | |
| 7,040,228 B2 | 5/2006 | Perault et al. | |
| 7,201,802 B2 | 4/2007 | Holm et al. | |
| 7,272,898 B2 | 9/2007 | McAllister | |
| 2002/0014602 A1 | 2/2002 | Holm et al. | |
| 2003/0027363 A1 | 2/2003 | Kodama | |
| 2004/0149151 A1 | 8/2004 | Yamasaki et al. | |
| 2005/0183594 A1 | 8/2005 | Perault et al. | |
| 2008/0289518 A1 | 11/2008 | Inoue et al. | |
| 2010/0116157 A1* | 5/2010 | Plachy et al. | 101/126 |
| 2010/0206189 A1* | 8/2010 | Moncavage | 101/129 |
| 2012/0145013 A1 | 6/2012 | Doyle | |
| 2012/0145015 A1 | 6/2012 | Doyle | |
| 2012/0145016 A1 | 6/2012 | Doyle | |

FOREIGN PATENT DOCUMENTS

| | | | |
|---|---|---|---|
| JP | 04107145 A * | 4/1992 | |
| JP | 2007096153 A | 4/2007 | |
| JP | 4618085 B2 | 1/2011 | |
| WO | 01/67835 A1 | 9/2001 | |
| WO | 2008/128754 A1 | 10/2008 | |

OTHER PUBLICATIONS

U.S. Appl. No. 12/963,448, filed Dec. 8, 2010.
U.S. Appl. No. 12/963,454, filed Dec. 8, 2010.
U.S. Appl. No. 12/963,455, filed Dec. 8, 2010.
International Search Report and Written Opinion for corresponding Application PCT/US2011/063977 mailed Sep. 7, 2012.
International Search Report and Written Opinion for corresponding Application PCT/US2011/063958 mailed Feb. 29, 2012.

* cited by examiner

*Primary Examiner* — Ren Yan

(74) *Attorney, Agent, or Firm* — Lando & Anastasi, LLP

(57) ABSTRACT

A combination stencil printer and dispenser includes a frame, a movable stencil coupled to the frame, a substrate support coupled to the frame to support a substrate in a print position, and a print head coupled to the frame to deposit and print viscous material over the stencil. The combination stencil printer and dispenser further includes a dispenser mounted on the movable stencil to dispense viscous material on the substrate when the substrate is in the print position. In other embodiments, the dispenser can be mounted on a stencil wiper or on an independent gantry provided within the combination stencil printer and dispenser.

12 Claims, 11 Drawing Sheets

COMBINATION STENCIL PRINTER AND DISPENSER AND RELATED METHODS

CROSS-REFERENCE TO RELATED APPLICATIONS

This application relates to U.S. patent application Ser. No. 12/963,448 entitled COMBINATION STENCIL PRINTER AND DISPENSER AND RELATED METHODS, by Dennis G. Doyle, filed on even date herewith, U.S. patent application Ser. No. 12/963,454 entitled COMBINATION STENCIL PRINTER AND DISPENSER AND RELATED METHODS, by Dennis G. Doyle, filed on even date herewith, and U.S. patent application Ser. No. 12/963,455 entitled METHODS FOR DEPOSITING VISCOUS MATERIAL ON A SUBSTRATE WITH A COMBINATION STENCIL PRINTER AND DISPENSER, by Dennis G. Doyle, filed on even date herewith. All of these related applications are incorporated herein by reference.

BACKGROUND OF THE INVENTION

1. Field of Disclosure

This disclosure relates generally to methods and apparatus for printing and dispensing viscous material, such as solder paste, onto a substrate, such as a printed circuit board, and more particularly to a combination stencil printer and dispenser and related methods of printing and dispensing.

2. Discussion of Related Art

In a typical surface-mount circuit board manufacturing operation, a stencil printer is used to print solder paste onto a printed circuit board. A circuit board, broadly referred to as an electronic substrate, having a pattern of pads or some other conductive surface onto which solder paste will be deposited, is automatically fed into the stencil printer. One or more small holes or marks on the circuit board, called fiducials, is used to align the circuit board with the stencil or screen of the stencil printer prior to the printing of solder paste onto the circuit board. The fiducials serve as reference points when aligning a circuit board to the stencil. Once a circuit board has been aligned with the stencil in the printer, the circuit board is raised to the stencil by a substrate support, e.g., a table having pins or other work holders. Solder paste is then dispensed by moving a wiper blade or squeegee across the stencil to force the solder paste through apertures formed in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste is typically dispensed onto the stencil from a standard solder paste supply cartridge. After the print operation, the board is then released, lowered away from the stencil, and transported to another station within the printed circuit board fabrication line. Specifically, the stencil is separated from the board and the adhesion between the board and the solder paste causes most of the material to stay on the board. Material left on the surface of the stencil is removed in a cleaning process before additional circuit boards are printed. In some applications, a cleaning assembly is moved under the stationary stencil and excess material is wiped off of the stencil as the cleaning assembly is moved. In another application, the stencil is moved over the stationary cleaning assembly to clean the underneath of the stencil.

The manufacturing of circuit boards involves many processes, one of which is the screen printing of solder paste (or other adhesives or materials) on the surface of a circuit board with the stencil printer so that electronic components can thereafter be deposited onto the board, which is described above. Another process is to dispense metered amounts of materials (liquid or paste) for a variety of applications with a separate dispenser. One such application is the assembly of integrated circuit chips and other electronic components onto circuit board substrates. In this application, automated dispensing systems are used for dispensing dots of liquid epoxy or solder paste, or some other related material, onto circuit boards. Automated dispensing systems are also used for dispensing lines of underfill materials and encapsulents, which mechanically secure components to the circuit board. Underfill materials and encapsulents are used to improve the mechanical and environmental characteristics of the assembly. Another application is to dispense very small amounts or dots onto a circuit board. Others include a syringe that utilizes pressure to dispense material from the syringe. In one system capable of dispensing dots of material, a dispensing pump utilizes a rotating auger having a helical groove to force material out of a nozzle and onto a circuit board. Yet another application is to dispense dots of material by using a jetter.

Another process in the printing of circuit boards involves inspection of the boards after solder paste has been deposited on the surface of the boards. Inspecting the boards is important for determining that clean electrical connections can be made. An excess of solder paste can lead to shorts, while too little solder paste in appropriate positions can prevent electrical contact. Generally, in a stencil printer, a vision inspection system is employed to provide a two-dimensional or a three-dimensional inspection of the solder paste on the board.

Stencil printers typically contain an individual personal computer or "PC" and the only standard level of communication to adjacent pieces of equipment is through an established protocol. For example, a printed circuit board fabrication line may include one or more pieces of equipment, such as stencil printers, dispensers, pick-and-place machines, reflow ovens, wave soldering machines and/or inspection machines. Typically, process lines including stencil printers and placement machines are operated by a pull system with the placement machines controlling the introduction of product into different pieces of equipment in the production line. This is typically done in an attempt to maximize cycle time performance, primarily of the placement equipment. The production line is usually designed around the placement machines. The placement machines are typically the more expensive equipment in the production line, and so effort is made to keep them operating at maximum capacity. Errors discovered in the printing process may require manual intervention to rectify, which can impact the flow of materials into the placement system, decreasing the utilization of the placement system.

BRIEF SUMMARY OF THE INVENTION

One aspect of the present disclosure is directed to a combination stencil printer and dispenser for depositing viscous material on a substrate. In one embodiment, the combination stencil printer and dispenser includes a frame, a stencil coupled to the frame, a substrate support coupled to the frame to support a substrate in a print position, and a print head coupled to the frame to deposit and print viscous material over the stencil. The print head is configured to move across the stencil. The combination stencil printer and dispenser further includes a cleaning assembly coupled to the frame to wipe excess viscous material from a bottom surface of the stencil. The cleaning assembly includes a wiper assembly and a movement mechanism coupled to the frame and the wiper assembly to move the wiper assembly across the stencil in a first direction. The combination stencil printer and dispenser further includes a dispenser coupled to the cleaning assembly to dispense viscous material on the substrate when the substrate is in the print position.

Embodiments of the combination stencil printer and dispenser include providing the dispenser with a dispensing unit secured to a frame member of the wiper assembly by a bracket. The bracket of the dispenser is coupled to a dispenser movement mechanism to move the dispenser with respect to the frame member of the wiper assembly in a second direction that is perpendicular to the first direction. The dispenser movement mechanism includes a linear bearing mounted on the frame member of the wiper assembly with the bracket being configured to ride along the linear bearing. The dispenser movement mechanism further includes a ball screw coupled to the bracket and configured to drive the movement of the bracket along the linear bearing. The dispenser movement mechanism further includes a motor coupled to the ball screw and configured to drive the rotation of the ball screw. In a certain embodiment, the dispenser includes another dispensing unit supported by the bracket. In another embodiment, the dispenser includes a mounting block coupled to a frame member of the wiper assembly and at least one dispensing unit supported by the mounting block and in fluid communication with at least one viscous material supply. The dispensing unit is configured to dispense viscous material delivered by the at least one viscous material supply. The dispenser further includes at least one motor supported by the mounting block and coupled to the at least one dispensing unit and a sensor configured to detect a distance of the at least one dispensing unit to the substrate. The movement mechanism of the cleaning assembly includes a pair of rail members secured to the frame and a belt and pulley drive mechanism. A controller is provided to control the operation of the combination stencil printer and dispenser.

Another embodiment of the present disclosure is directed to a method of depositing viscous material on a substrate. In a particular embodiment, the method comprises: positioning the substrate in a print position; performing a print operation on the substrate with a print head and a stencil to deposit viscous material on the substrate; and depositing viscous material on the substrate with a dispenser attached to a cleaning assembly.

Embodiments of the method include imaging fiducials associated with the substrate and aligning the substrate with the stencil when positioning the substrate in the print position. The method further includes delivering the substrate to the substrate support prior to positioning the substrate in the print position, cleaning a bottom surface of the stencil with the cleaning assembly, and/or inspecting the substrate with a vision system to detect a defect with the deposit of viscous material on the substrate. Inspecting the substrate with the vision system includes moving the vision system over the substrate with a vision system gantry under the control of a controller. Depositing viscous material on the substrate with the dispenser is performed after inspecting the substrate with the vision system to detect a defect. The dispenser is configured to fix the defect.

Yet another aspect of the present disclosure is directed to a combination stencil printer and dispenser including a frame and a stencil coupled to the frame by a stencil shuttle configured to support and move the stencil in a first direction between a print position in which the stencil is located at one of a front and a back of the combination stencil printer and dispenser and a non-print position in which the stencil is located at the other of the front and the back of the combination stencil printer and dispenser. The combination stencil printer and dispenser further includes a substrate support coupled to the frame to support a substrate in a print position and a print head coupled to the frame to deposit and print viscous material over the stencil. The print head is configured to move across the stencil. The combination stencil printer and dispenser further includes a dispenser coupled to the stencil shuttle to dispense viscous material on the substrate when the substrate is in the print position.

Embodiments of the combination stencil printer and dispenser include a bracket mounted on the stencil shuttle, and a dispensing unit supported by the bracket. The bracket of the dispenser is coupled to a dispenser movement mechanism to move the dispenser with respect to the stencil shuttle in a second direction that is perpendicular to the first direction. The dispenser movement mechanism includes a linear bearing mounted on the stencil shuttle, the bracket being configured to ride along the linear bearing. The dispenser movement mechanism further includes a ball screw coupled to the bracket and configured to drive the movement of the bracket along the linear bearing. The dispenser movement mechanism further includes a motor coupled to the ball screw and configured to drive the rotation of the ball screw. The dispenser includes another dispensing unit supported by the bracket. The stencil shuttle includes a pair of rail members secured to the frame and a drive mechanism coupled to the stencil shuttle.

A further aspect of the disclosure is directed to a method of depositing viscous material on a substrate, the method comprising: positioning the substrate in a print position; performing a print operation on the substrate with a print head and a stencil to deposit viscous material on the substrate; and depositing viscous material on the substrate with a dispenser attached to a stencil shuttle configured to support the stencil.

Embodiments of the method include imaging fiducials associated with the substrate and aligning the substrate with the stencil when positioning the substrate in the print position. The method further includes delivering the substrate to the substrate support prior to positioning the substrate in the print position, cleaning a bottom surface of the stencil with a cleaning assembly, and/or inspecting the substrate with a vision system to detect a defect with the deposit of viscous material on the substrate. Inspecting the substrate with the vision system includes moving the vision system over the substrate with a vision system gantry under the control of a controller. Depositing viscous material on the substrate with the dispenser is performed after inspecting the substrate with the vision system to detect a defect. The dispenser is configured to fix the defect.

One more aspect of the disclosure is directed to a combination stencil printer and dispenser including a frame, a stencil coupled to the frame, a substrate support coupled to the frame to support a substrate in a print position, a print head coupled to the frame to deposit and print viscous material over the stencil, and an independent gantry coupled to the frame. The gantry is configured to move in a first direction. The combination stencil printer and dispenser further includes a dispenser coupled to the independent gantry to dispense viscous material on the substrate when the substrate is in the print position.

Embodiments of the combination stencil printer and dispenser include providing a bracket on a frame member of the independent gantry and a dispensing unit supported by the bracket. The bracket of the dispenser is coupled to a dispenser movement mechanism to move the dispenser with respect to the frame member of the independent gantry in a second direction that is perpendicular to the first direction. The dispenser movement mechanism includes a linear bearing mounted on the frame member of the independent gantry with the bracket being configured to ride along the linear bearing. The dispenser movement mechanism further includes a ball screw coupled to the bracket and configured to drive the movement of the bracket along the linear bearing. The dispenser movement mechanism further includes a motor coupled to the ball screw and configured to drive the rotation of the ball screw. The movement mechanism of the independent gantry includes a pair of rail members secured to the frame and a drive mechanism.

A further aspect of the disclosure is directed to a method comprising: positioning the substrate in a print position; performing a print operation on the substrate with a print head and a stencil to deposit viscous material on the substrate; and depositing viscous material on the substrate with a dispenser attached to an independent gantry of the combination stencil printer and dispenser.

Another aspect of the present disclosure is directed to a method of depositing viscous material on a substrate with a combination stencil printer and dispenser. The method comprises: positioning the substrate in a print position; performing a print operation on the substrate with a print head and a stencil to deposit viscous material on the substrate; and inspecting the substrate with a vision system to detect a defect with the deposit of viscous material on the substrate. In one embodiment, the method further includes, in the event of a defect, re-working the substrate by depositing viscous material on the substrate with a dispenser attached to a cleaning assembly to correct the defect. In another embodiment, the method further includes, in the event of a defect, re-working the substrate by depositing viscous material on the substrate with a dispenser attached to the stencil to correct the defect. In yet another embodiment, in the event of a defect, re-working the substrate by depositing viscous material on the substrate with a dispenser attached to an independent gantry to correct the defect.

The present disclosure will be more fully understood after a review of the following figures, detailed description and claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
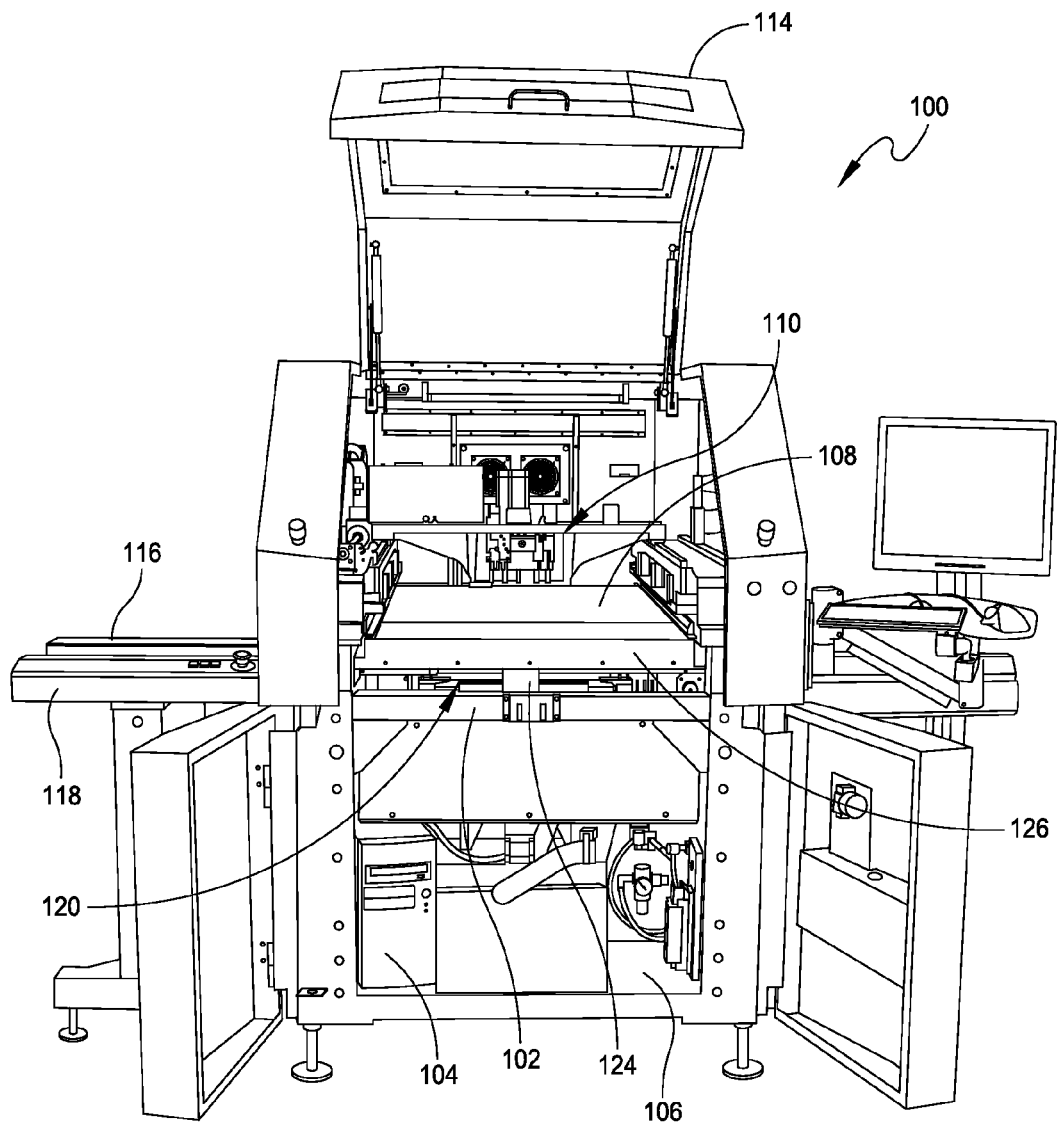
FIG. 1 is a front perspective view of a combination stencil printer and dispenser of an embodiment of the disclosure.

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The present disclosure relates generally to material application machines, such as stencil printers, which may otherwise be referred to as "screen printers," "printing machines" or "printers." The present disclosure further relates to dispensers, such as traditional dispensers employing auger screw dispensers or dispensers employing a device capable of jetting material (otherwise referred to as "jetters"), and other equipment utilized in surface mount technology ("SMT") process lines. Such equipment may be configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate.

In one example, a combination stencil printer and dispenser may be configured to perform a print operation and a dispense operation. Specifically, in a particular embodiment, the unit may include a combination stencil printer and dispenser that enables the operator to print an assembly material onto a circuit board at a print station, and repair poorly printed boards at the stencil printing station rather than a separate rework station. When a defect is detected on a board, and the board is identified as being defective after inspection, the board may be reworked directly within the same machine rather than being removed from the machine where the defect was discovered. In addition, in another embodiment, such a combination stencil printer and dispenser may be used to dispense a secondary material, such as adhesive, on the printed circuit board at the stencil printing station. The dispenser may be further configured to dispense large quantities of paste for large-part soldering.

In order to facilitate a reduction in space taken up by a production line, or complexity of accessing a board within a printing machine, and to facilitate a reduction in interruptions of the process line and therefore greater efficiency, some embodiments disclosed herein include providing other components in the combination stencil printer and dispenser.

Exemplary platforms, which may be modified to perform print and dispense operations in accordance with the methods disclosed herein, may include, but are not limited to the ACCELA® and MOMENTUM™ stencil printers offered by Speedline Technologies, Inc. of Franklin, Mass., the assignee of the present disclosure.

FIG. 1 shows a front perspective view of a combination stencil printer and dispenser, generally indicated at 100, in accordance with one embodiment of the disclosure. The combination stencil printer and dispenser 100, which is sometimes referred to herein simply as a "combination printer," may be configured from a MOMENTUM stencil printer platform identified above. The combination printer 100 includes a frame 102 that supports components of the combination printer, including but not limited to a controller 104 located in a cabinet 106 of the combination printer, a stencil 108, and a dispensing head, generally indicated at 110, for dispensing a viscous material, such as solder paste. The stencil 108 has apertures (not shown) through which viscous material is deposited on the surface of a circuit board, such as circuit board 112 shown in FIG. 1. The dispensing head 110 may be movable along orthogonal axes by a gantry system (not designated) under the control of the controller 104 to allow printing of the viscous material on the circuit board, which, as mentioned above, may sometimes be referred to as an electronic substrate. A cover 114 is shown in an open position to reveal the internal components of the combination printer 100.

Circuit boards 112 that are fed into the combination printer 100 typically have a pattern of pads or other, usually conductive surface areas onto which viscous material will be deposited. The combination printer 100 also includes a conveyor system having rails 116, 118 for transporting the circuit board 112 in an x-axis direction to a printing position in the combination printer. Such a transport system including rails 116, 118 is sometimes referred to as a "tractor feed mechanism." In some implementations, the combination printer 100 has a support assembly 120, e.g., pins, gel membranes, etc., positioned beneath the circuit board 112 when the circuit board is in the print position. The support assembly 120 may be used to raise the circuit board 112 off of the rails 116, 118 to place the circuit board in contact with, or in close proximity to, the stencil 108 when printing (i.e., solder paste depositing) is to occur. When directed by the controller 104 of the combination printer 100, the tractor feed mechanism supplies boards to a location over the support assembly 120 and under the stencil 108. Once arriving at the position under the stencil 108, the circuit board 112 is in place for a manufacturing operation.

In one embodiment, the dispensing head 110 may be configured to receive at least one solder paste cartridge (not shown) that provides the viscous material, such as solder paste, to the dispensing head during a printing operation. In one embodiment, the solder paste cartridge is coupled to one end of a pneumatic air hose in a well-known manner. The other end of the pneumatic air hose may be attached to a compressor contained within the frame 102 of the combination printer 100 that, under the control of the controller, provides pressurized air to the cartridge to force solder paste into the dispensing head 110 and onto the stencil 108. Other configurations for dispensing solder paste onto the stencil 108 may also be employed. For example, in other embodiments, mechanical devices, such as a piston, may be used in addition to, or in place of, air pressure to force the solder paste from the cartridge into the dispensing head 110. In yet another embodiment, the controller 104 may be implemented using a personal computer having a suitable operating system (e.g., Microsoft® DOS, Windows® NT, Windows Vista, UNIX, etc.) with application specific software to control the operation of the combination printer 100 as described herein.

The combination printer 100 further includes a vision inspection system 124 that is configured to move into position over the circuit board 112 by a vision gantry 126 (FIG. 3) to align the circuit board delivered to the print position and to inspect the solder paste deposits to determine whether the solder paste has been accurately placed on the circuit board.

To successfully deposit solder paste on the circuit board 112, the circuit board and the stencil 108 are aligned, via the controller 104. Alignment is accomplished by moving the stencil 108 or circuit board 112 based on readings from the vision inspection system 124. When the stencil 108 and the circuit board 112 are aligned correctly, the stencil is lowered toward the circuit board for application of the solder paste through the apertures, or the circuit board can be raised toward the stencil by the support assembly 120. After the print operation, inspection of the circuit board 112 aids in ensuring that the proper amount of viscous material has been deposited and that the viscous material has been deposited at the proper locations on the circuit board. The vision inspection system 124 can use fiducials, chips, board apertures, chip edges, or other recognizable patterns on the circuit board 112 to determine proper alignment. After inspection of the circuit board 112, the controller 104 controls movement of the circuit board to the next location using the tractor feed mechanism, where electrical components may be placed on the circuit board.

In some embodiments, the combination printer 100 may operate as follows. The circuit board 112 may be loaded into the stencil printer 100 in a print position using the conveyor rails 116, 118 and by aligning the circuit board with the stencil 108. The dispensing head 110 may then be lowered in the Z-direction until it is in contact with the stencil 108. The dispensing head 110 may fully traverse the stencil 108 in a first print stroke to force solder paste through apertures of the stencil and onto the circuit board 112. Once the dispensing head 110 has fully traversed the stencil 108, the circuit board 112 may be transported by the conveyor rails 116, 118 from the combination printer 1000 so that a second, subsequent circuit board 112 may be loaded into the combination printer. To print on the second circuit board 112, the dispensing head 110 may be moved in a second print stroke across the stencil in an opposite direction to that used for the first circuit board.

Figure 2:
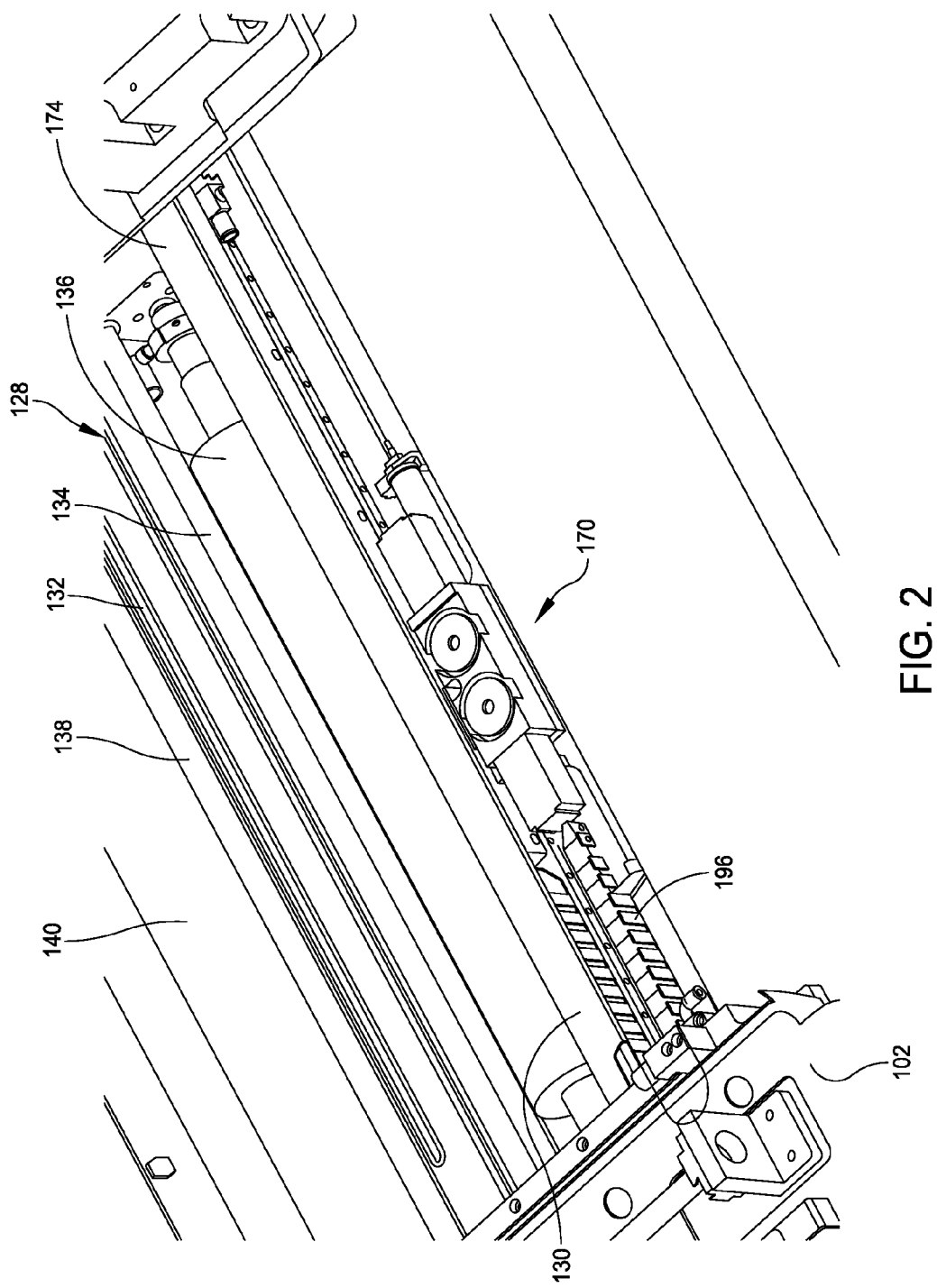
FIG. 2 is a top perspective view of a dispenser and a stencil cleaning assembly of the stencil printer.
Figure 3:
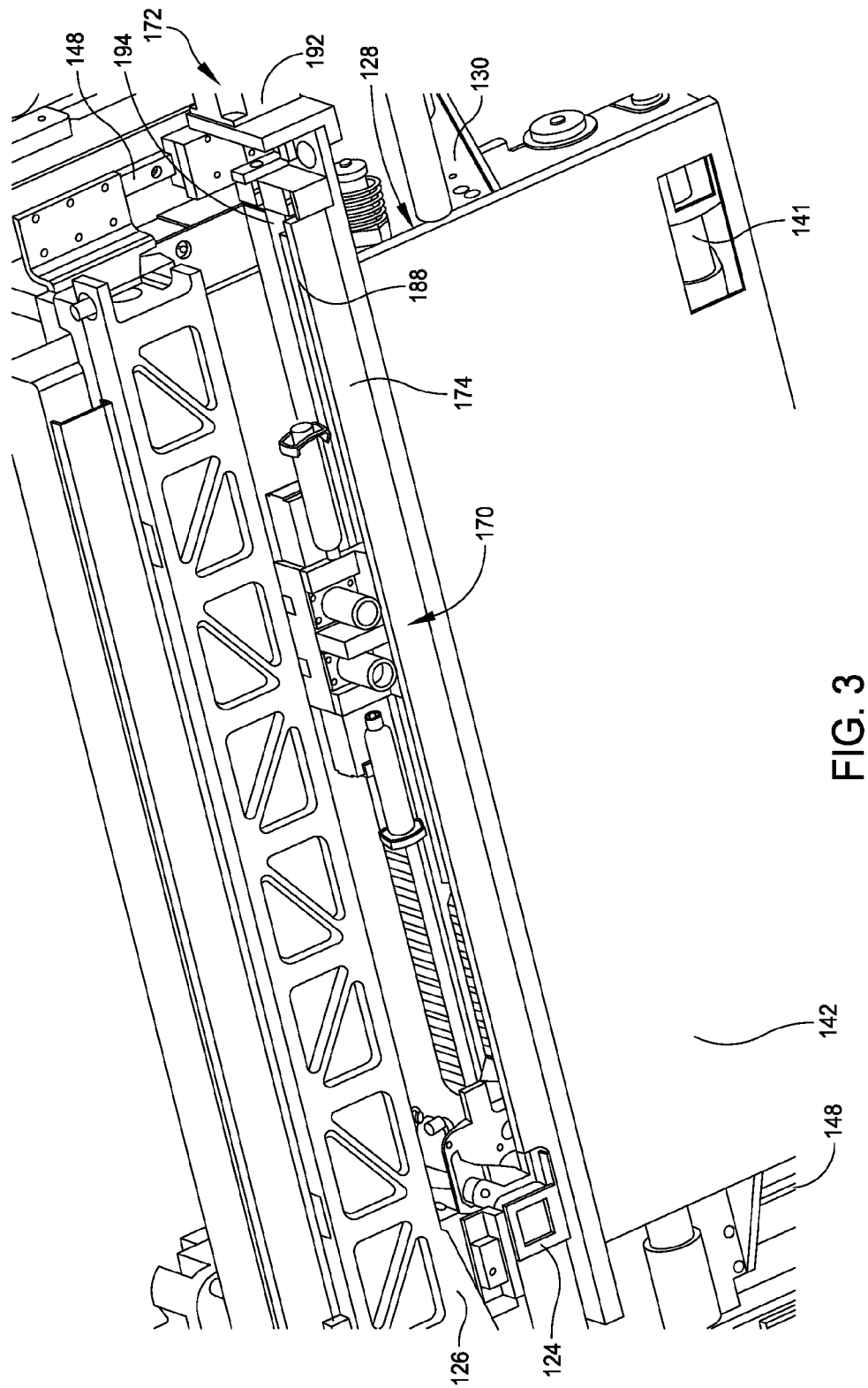
FIG. 3 is a bottom perspective view of the dispenser and the stencil cleaning assembly.

After one or more applications of the solder paste on the circuit boards 112, excess viscous material may accumulate at the bottom of the stencil 108. Referring to FIGS. 2 and 3, the combination stencil printer and dispenser 100 may be configured with a stencil wiper cleaning assembly, generally indicated at 128, which moves beneath the stencil 108 to remove the excess solder paste from the stencil. For the embodiment illustrated in FIGS. 1-9, the stencil wiper cleaning assembly 128 moves from a back of the combination printer 100 to a front of the combination printer in a y-axis direction to wipe excess material from the stencil 108. In other embodiments, such as with the ACCELA stencil printer identified above and described with reference to FIG. 10, a stencil may be moved in the y-axis direction from a front of the stencil printer to a back of the stencil printer in which the stencil travels over a stencil wiper cleaning assembly provided at the back of the stencil printer. This particular embodiment of the combination printer that moves the stencil will be described in greater detail below.

Referring to FIGS. 2 and 3, as described above, the stencil wiper cleaning assembly 128 is provided to wipe excess viscous material from the bottom surface of the stencil 108. With this embodiment, the stencil wiper cleaning assembly 128 is configured to move under the stencil 108 to clean a bottom surface of the stencil. Removal of excess viscous material, such as solder paste, can occur after each print cycle, or after a number of print cycles when it has been determined that a substantial amount of viscous material is on the surface of the stencil 108 and should be removed. Additionally, before the circuit board 112 can move to a next print operation in the combination printer 100 or otherwise, the circuit board is inspected to determine the accuracy with which viscous material has been deposited on the surface of the circuit board.

As will be described in greater detail below with reference to FIGS. 4 and 5, a y-axis movement mechanism or carriage is provided to drive the y-axis movement of the stencil wiper cleaning assembly 128. As shown in FIGS. 2 and 3, the stencil wiper cleaning assembly 128 includes a frame assembly 130, which is configured to support the components of the stencil wiper cleaning assembly and is movable by the y-axis movement mechanism. The frame assembly 130 is configured to support a vacuum plenum 132, a paper supply that disposes paper over the vacuum plenum, and a solvent application device 134 to apply solvent on the paper. In one embodiment, the paper supply includes a roll of paper housed on a supply roller 136, an idler shaft 138, a take-up roller 140 for receiving the used paper, and a paper or web material driver 141 (FIG. 3) for moving the paper across the stencil 108 in a linear direction from the supply roller to the take-up roller. It should be noted that the web of paper is not shown as it extends over the various components of the stencil wiper cleaning assembly 128 so as to more clearly illustrate some of these components.

In one embodiment, the solvent application device 134 includes a solvent roller that rotates within a bath of solvent to apply solvent onto the paper as the paper moves between the supply roller 136 and the take-up roller 140. In other embodiments, the solvent application device 134 includes a hollow solvent tube with numerous small openings formed along the length of the tube. The vacuum plenum 132 includes a wiper blade for removing excess solvent and hardened solder paste from the paper as it travels underneath the stencil 108. The vacuum plenum 132 is capable of moving the paper between a first position in which the paper is spaced away from the stencil 108 and a second position in which the paper engages the stencil to wipe and draw excess material from the stencil onto the paper.

During a cleaning operation, the paper driver rotates the paper supply roller 136 by driving the rotation of the take-up roller 140, which passes paper over the solvent roller 134 to wet the paper prior to the engagement of the paper to the stencil 108. The solvent impregnated paper is passed to the vacuum plenum 132, which holds the paper in place as the stencil wiper cleaning assembly 128 moves under the stencil 108, thereby cleaning the stencil. The vacuum plenum 132 is operable to selectively engage the stencil 108 with the paper being disposed between the vacuum plenum and the stencil. Excess solder paste is wiped off the stencil 108 as the vacuum plenum 132 engages and moves along a length of the stencil with the vacuum plenum drawing excess material from the stencil. As illustrated in FIG. 3, the stencil wiper cleaning assembly further includes a belly pan 142 to contain excess solder and solvent not captured on the paper during a stencil wipe procedure to protect components of the combination printer 100 and to prevent such contaminants from being deposited on the printed circuit board 112.

In certain embodiments, the operation of the stencil wiper cleaning assembly 128, including the operation of the vacuum plenum 132 and the paper supply is described in detail in the following references: U.S. Pat. No. 6,955,121, entitled METHODS AND APPARATUS FOR CLEANING A STENCIL; U.S. Pat. No. 7,017,489, entitled METHODS AND APPARATUS FOR CHANGING WEB MATERIAL IN A STENCIL PRINTER; and U.S. Pat. No. 7,040,228, entitled SELF-CONTAINED VACUUM MODULE FOR STENCIL WIPER ASSEMBLY, all of which are assigned to Speedline Technologies, Inc. of Franklin, Mass., and incorporated herein by reference in their entirety for all purposes.

Figure 4:
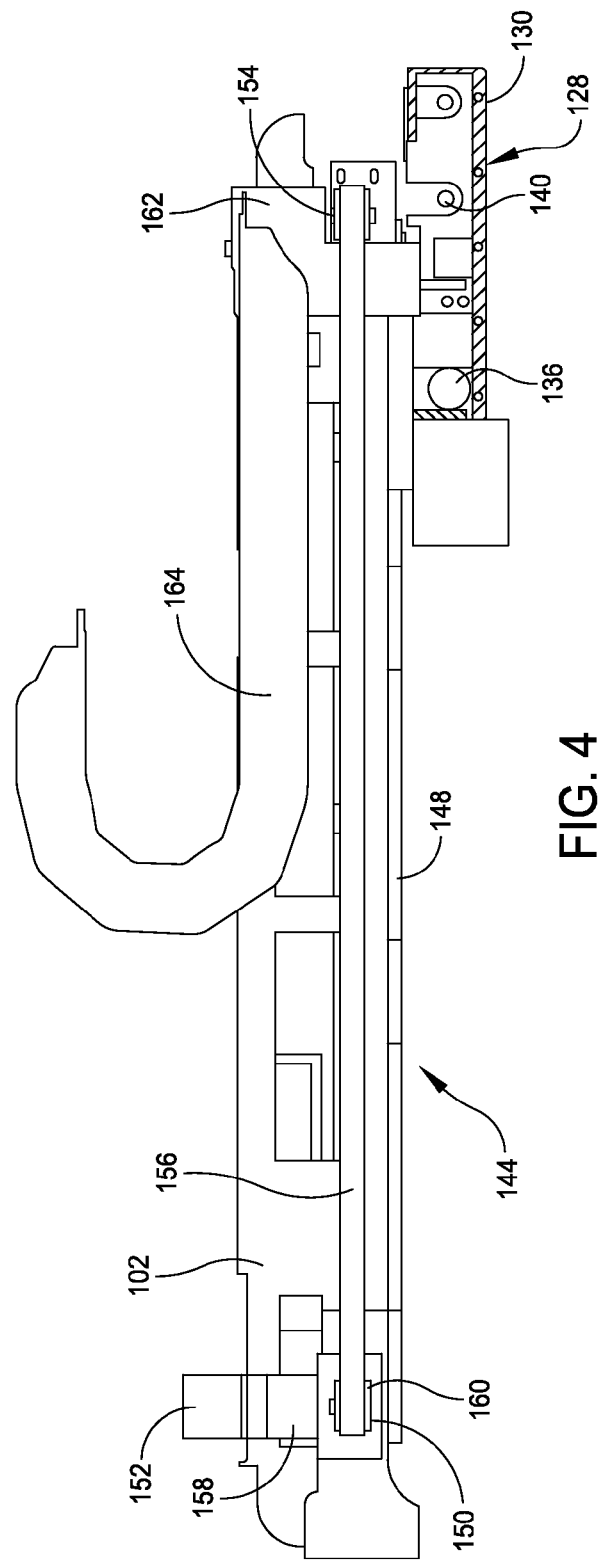
FIG. 4 is an outside partial cross-sectional right side view of a y-axis movement mechanism of the stencil cleaning assembly that is movable within the combination stencil printer and dispenser.
Figure 5:
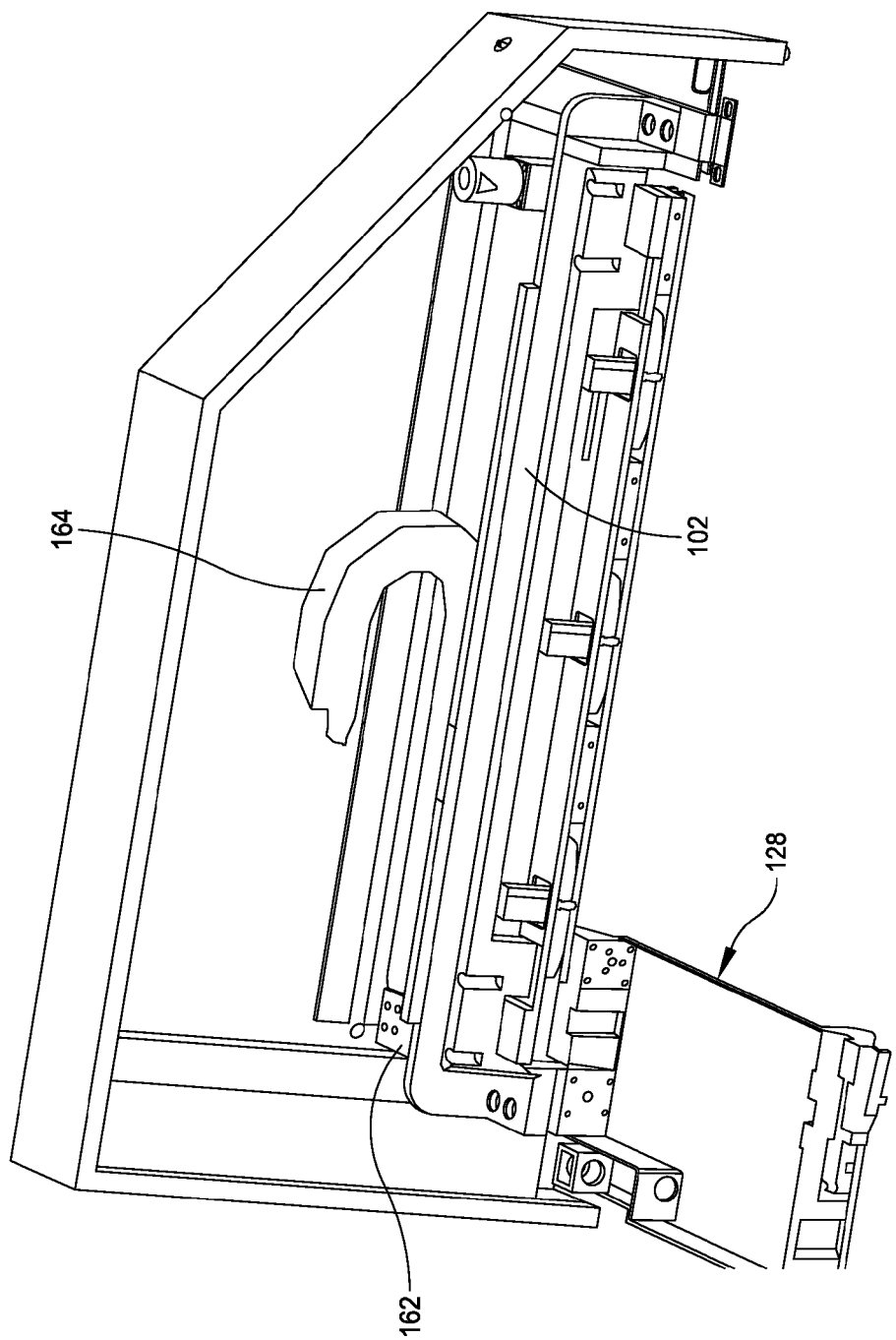
FIG. 5 is an inside perspective view of the y-axis movement mechanism.
Figure 6:
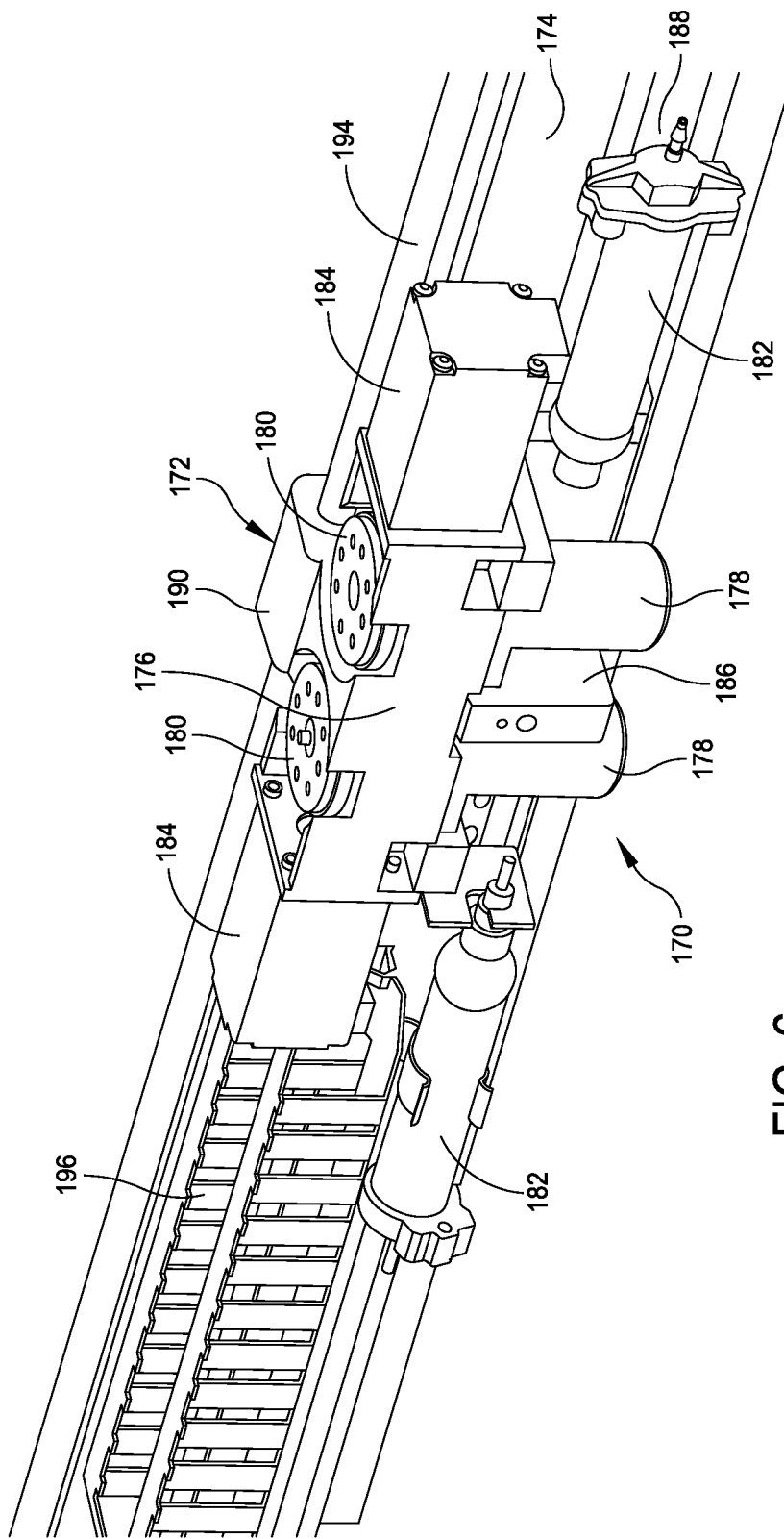
FIGS. 6 and 7 are enlarged perspective views of the dispenser and an x-axis movement mechanism configured to move the dispenser.
Figure 7:
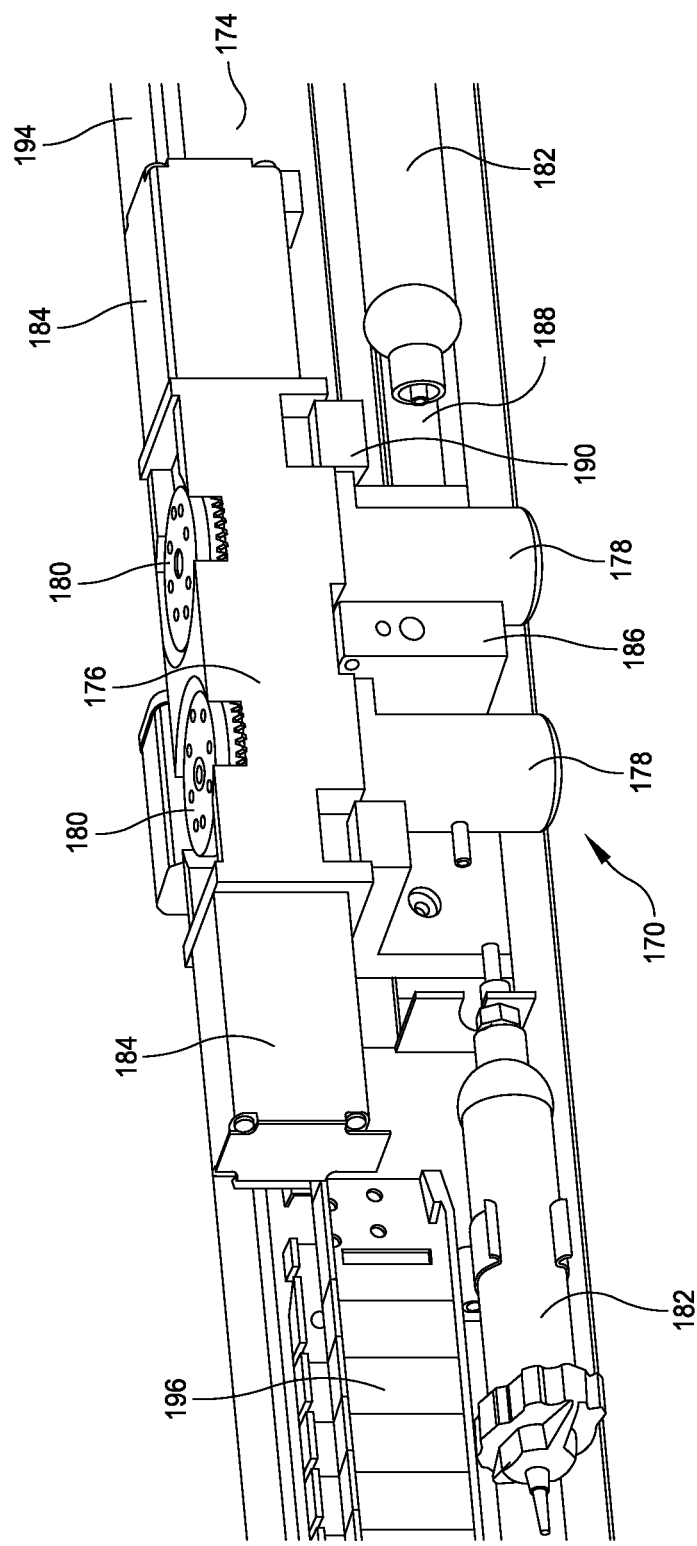
Figure 8:
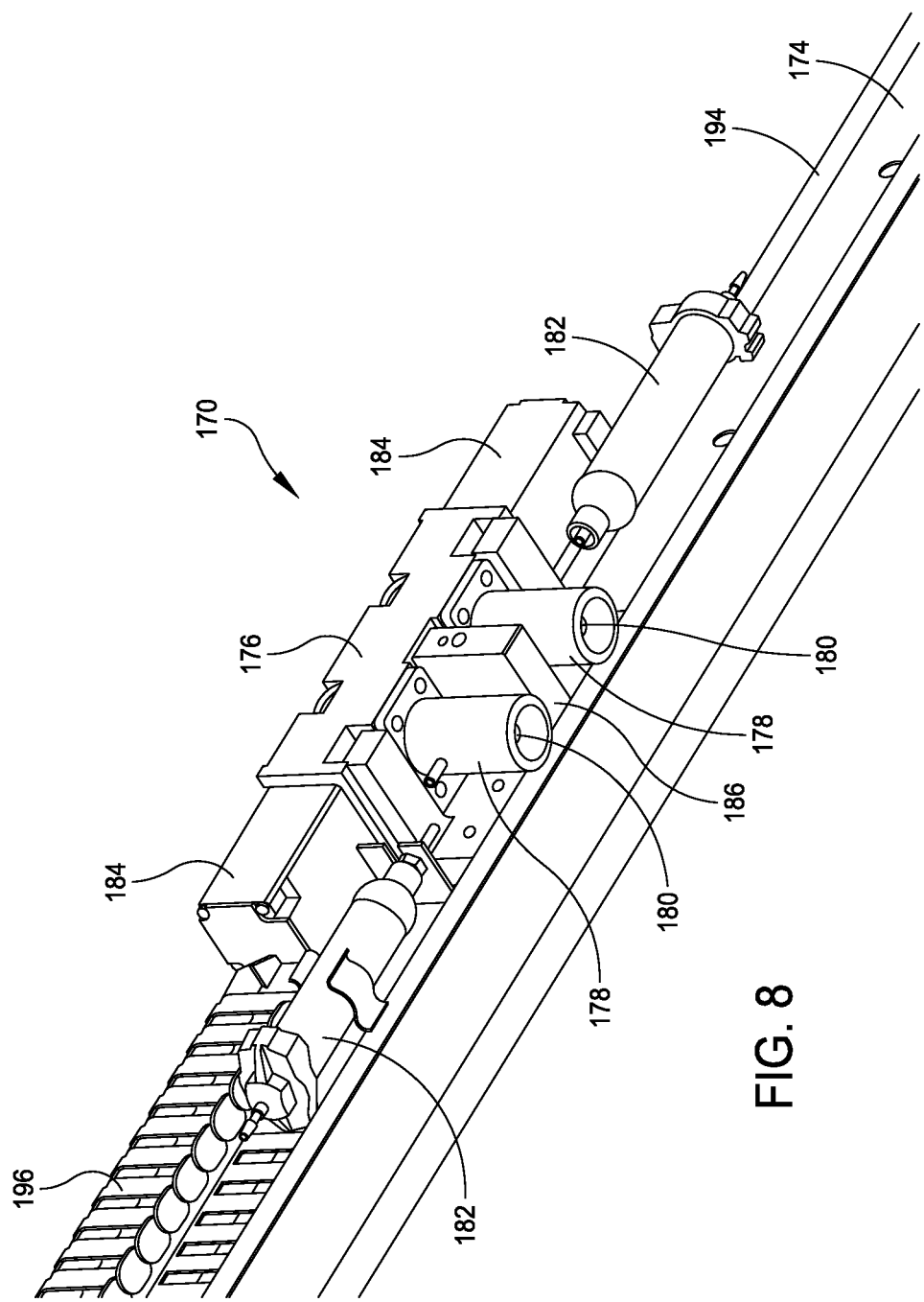
FIG. 8 is an enlarged bottom perspective view of the dispenser and the x-axis movement mechanism.

Turning now to FIGS. 4 and 5, the stencil wiper assembly is mounted on a pair of rails and situated at one end (e.g., the back) of the combination printer 100. As will be discussed with reference to the combination printer illustrated in FIG. 10, the stencil wiper cleaning assembly may also stay stationary as the stencil is moved over the assembly to perform the cleaning operation. As discussed above, the components of the stencil wiper cleaning assembly 128 including the frame assembly 130 are coupled to a y-axis movement mechanism, generally indicated at 144, which is in turn coupled to the frame 102. Specifically, for each side of the stencil wiper cleaning assembly 128, the frame assembly 130 of the stencil wiper cleaning assembly rides on a linear rail 148, on which the stencil wiper cleaning assembly is moved back and forth using a belt and pulley drive mechanism. Alternatively, rack and pinion, chain and pulley, or ball screw drive mechanisms may be used in place of the belt and pulley mechanism to drive the movement of the stencil wiper cleaning assembly 128. The belt and pulley drive mechanism includes a first pulley 150 that is suitably driven by a motor 152, a second pulley 154, and a belt 156, which suitably drives the movement of the stencil wiper cleaning assembly 128. The belt and pulley drive mechanism may further include a gear reducer 158 and a belt tension adjuster 160. In the shown embodiment, a y-axis movement mechanism includes an interface plate 162 to couple the belt 156 to the frame assembly 130 of the stencil wiper cleaning assembly 128.

The arrangement is such that the stencil wiper cleaning assembly 128 is moved along in the y-axis direction by the y-axis movement mechanism 144 by controlling the operation of the motor 152. In one embodiment, the controller 104 may be programmed to control the operation of the y-axis movement mechanism 144. A cable carrier 164 is provided to protect the wires and cables controlling the operation of the y-axis movement mechanism 144.

In addition to the views of the stencil wiper cleaning assembly shown in FIGS. 2 and 3, reference can also be made to FIGS. 6-9, which illustrates a dispenser, generally indicated at 170, to dispense viscous material on the circuit board 112 when the circuit board is in the dispense position. As shown, the dispenser 170 is secured or otherwise coupled to an x-axis movement mechanism, generally indicated at 172, to move the dispenser back and forth in an x-axis direction with respect to a frame member 174 of the frame assembly 130 of the stencil wiper cleaning assembly 128. Thus, it should be observed that the dispenser 170 is capable of being positioned over the circuit board 112 at any location by manipulating the y-axis movement mechanism 144 and the x-axis movement mechanism 172, preferably under the control of the controller 104.

The components embodying the dispenser 170 will be discussed first. The dispenser 170 illustrated throughout the drawings is a two unit dispenser capable of dispensing two different types of materials, if desired, or capable of dispensing the same material. As shown, the dispenser 170 includes a mounting block 176, two pump mount housings, each indicated at 178, which are each secured to the mounting block in a position under the mounting block, and two dispensing units, each indicated at 180, which are each supported by respective pump mount housings. In the shown embodiment, each dispensing unit 180 may be configured with an auger pump having a dispensing needle or nozzle to dispense viscous material onto the circuit board 112. Two separate viscous material supply cartridges, each indicated at 182, one for each dispensing unit 180, are suitably coupled to the mounting block 176 and are configured to supply viscous material to their respective dispensing unit. In certain embodiments, each viscous material supply cartridge 182 is configured to contain viscous material, such as solder paste, adhesive and the like, and includes a syringe and a sensor configured to detect insufficient viscous material in the syringe. Each viscous material supply cartridge 182 is in fluid communication with its respective dispensing unit 180, which in turn is powered by a motor 184 having an encoder. As shown, the motors 184 are supported by the mounting block 176 on opposite ends of the mounting block.

Although the dispenser 170 illustrated throughout the drawings includes two dispensing units 180, it should be understood that the dispenser may be configured with any number of dispensing units, such as a single dispensing unit or three or more dispensing units, and still fall within the scope of the present embodiment. In addition, the dispenser 170 may further include a board height sensor 186, which is configured to detect a distance of the printed circuit board 112 from the dispenser units 180. Each dispensing unit 180 of the dispenser 170 may also be configured to move vertically in a z-axis direction by one of two methods—using the support assembly 120 to raise and lower the circuit board 112 and by using an air cylinder to push the dispensing units 180 to dispense positions. The movement of the support assembly 120 and/or the air cylinders may be performed by the controller 104.

Figure 9:
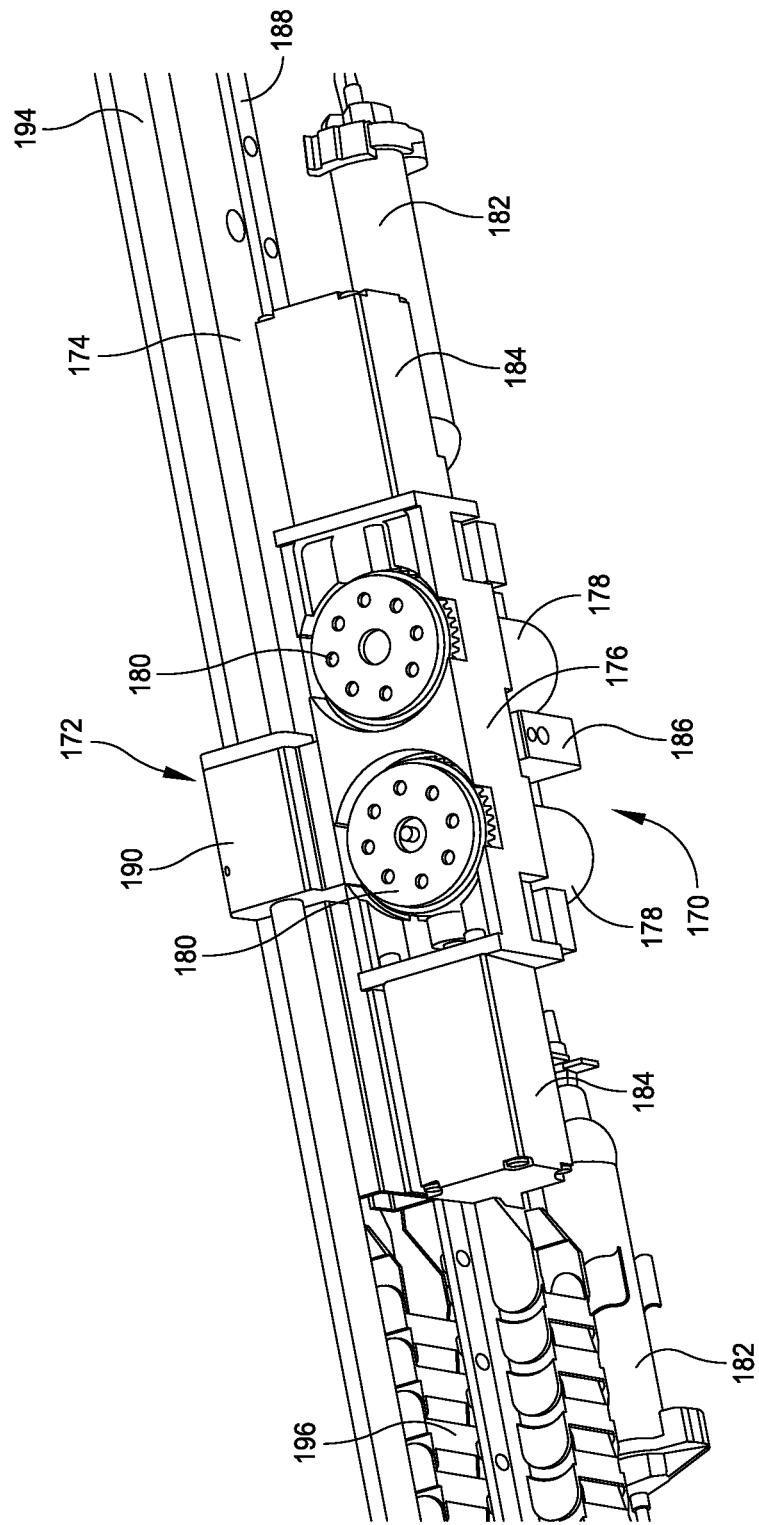
FIG. 9 is an enlarged top perspective view of the dispenser and the x-axis movement mechanism.

As mentioned, the dispenser 170 is movable in the x-axis direction by the x-axis drive mechanism 172, which includes a linear rail or bearing that is mounted on the frame member 174 of the frame assembly 130 of the stencil wiper cleaning assembly 128. The mounting block 176 is secured to a bracket 190, which is configured to ride on the linear rail 188 to provide movement in the x-axis direction. As best shown in FIGS. 3 and 9, driving the movement of the dispenser 170 is a motor 192 mounted on the frame assembly 130 of the stencil wiper cleaning assembly 128, which drives the rotation of a ball screw 194. The bracket 190 includes a nut (not shown) that receives the ball screw 194 to drive the movement of the dispenser 170 with respect to the stencil wiper cleaning assembly 128 in the x-axis direction. As with the y-axis movement mechanism 144, any suitable drive mechanism may be selected for powering the movement of the dispenser in the x-axis direction. In one embodiment, the controller 104 is configured to control the movement of the dispenser in the x-axis direction by the x-axis movement mechanism 172. Another cable carrier 196 is provided to protect the wires and cables controlling the operation of the x-axis movement mechanism 172.

In operation, the combination printer 100 is configured to perform a stencil print operation on a printed circuit board 112 in the known manner. After printing, a dispense operation may also take place by using the dispenser 170 provided on the stencil wiper cleaning assembly 128. In one embodiment, a method of depositing viscous material on a circuit board 112 delivered to the combination printer 100 includes delivering a circuit board to the combination printer, positioning the circuit board in the print and dispense positions, performing a print operation on the circuit board with the dispensing head 110 and the stencil 108 to deposit viscous material on the circuit board, and depositing viscous material on the circuit board with the dispenser 170, which is attached to the stencil wiper cleaning assembly 128. When positioning the circuit board 112 in the print position, the circuit board is aligned with the stencil 108. When positioning the circuit board 112 in the dispense position, the imaging system may be used to detect a fiducial on the circuit board to accurately dispense material. Once the printing and dispensing takes place, a bottom surface of the stencil 108 is cleaned with the stencil wiper cleaning assembly 128. Alternatively, or in addition to cleaning the stencil 108, the circuit board 112 is inspected with the vision inspection system 124 to detect a defect with the deposit of viscous material on the circuit board. When inspecting, the vision gantry 126 is provided to move the vision inspection system 124 over the circuit board 112 under the control of a controller 104.

In another embodiment, a method of depositing viscous material on a substrate delivered to the combination printer 100 includes positioning the circuit board 112 in the print position, performing a print operation on the circuit board with the dispensing head 110 and the stencil 108 to deposit viscous material on the circuit board, inspecting the circuit board with the vision inspection system 124 to detect a defect with the deposit of viscous material on the circuit board, and, in the event of a defect, re-working the circuit board by depositing viscous material on the circuit board the dispenser 170, which is attached to the cleaning assembly 128, to correct the defect.

Figure 10:
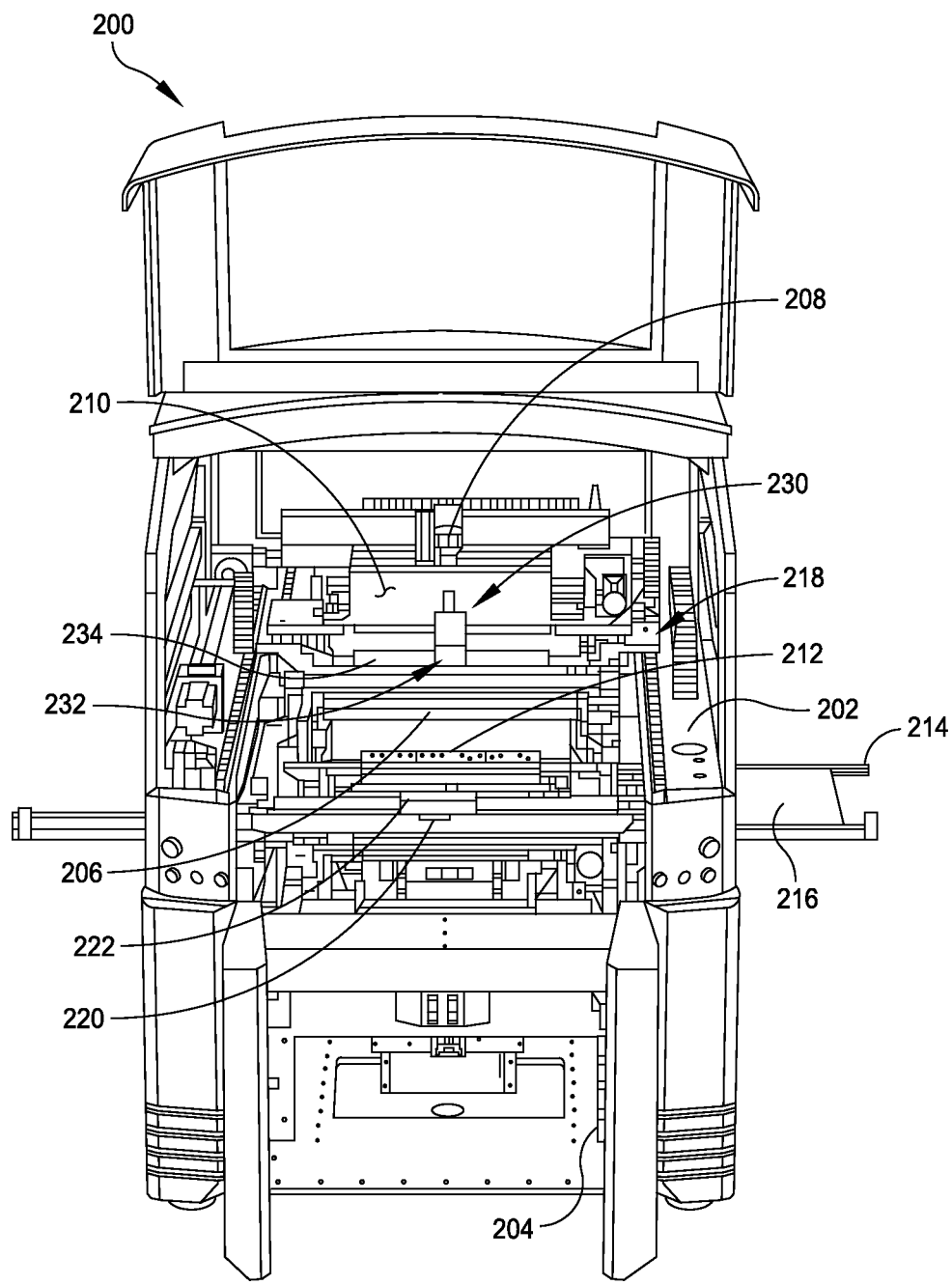
FIG. 10 is a front perspective view of a combination stencil printer and dispenser of another embodiment of the disclosure.

Turning now to FIG. 10, a combination stencil printer and dispenser of another embodiment is generally indicated at 200. The combination printer 200 includes a frame 202, a controller 204, a movable stencil 206, at least one solder paste cartridge 208, a dispensing head 210, a circuit board support assembly 212, and a tractor feed mechanism 214 configured to transport a circuit board 216. The circuit board 216 enters the combination printer 200 on the tractor feed mechanism 214. The movable stencil 206 includes a stencil shuttle 218, which supports and moves the stencil 206 to a position above the circuit board 216 to perform a print operation on the circuit board when the circuit board is in the print position. The controller 204 is internal to the mechanisms of the combination printer 200, and is configured to receive signals from operations in the combination printer, such as alignment of the circuit board 216, movement of the movable stencil 206, and deposit of the viscous material, and control the printer accordingly.

A vision inspection system 220 is provided to align the circuit board 216 and the movable stencil 206 and to inspect the circuit board after the print operation. When inspecting, the vision inspection system 220 moves over the circuit board 216 by a vision gantry 222 to inspect the viscous material deposits to determine whether the viscous material has been accurately placed on the circuit board. After inspection of the circuit board 216, the controller 104 controls movement of the circuit board 216 to the next location using the tractor feed mechanism 214, where electrical components will be placed on the circuit board. In addition to vision inspection of the circuit board 216 upon completion of the deposition of viscous material onto the circuit board, in one embodiment of the disclosure, the movable stencil 206 is cleaned using a stencil wiper (not shown) to remove excess solder paste from the surface of the movable stencil prior to beginning a print cycle on a next circuit board. Generally, as described above with reference to the combination printer 100 shown and described in FIGS. 1-9, the stencil wiper of combination printer 200 used to clean the movable stencil 206. With the combination printer 200, the stencil wiper is positioned at a rear of the combination printer to wipe the surface of the movable stencil 206 after printing has occurred and the movable stencil is moved to the rear of the combination printer.

Specifically, to accomplish improvements and efficiency in the print cycle, with the combination printer 200 the board inspection process and the stencil cleaning process occur substantially in parallel. During the inspection of at least one of the circuit boards 216, the movable stencil 206 is moved to a position where a stencil wipe process occurs. In operation, after printing, the movable stencil 206 translates, for example toward the back of the combination printer 200, to be cleaned. The movable stencil 206 can move by way of the stencil shuttle 218 in a forward and backward motion. The movable stencil 206 is cleaned by moving from front to back over the stencil wiper, as the stencil wiper contacts the bottom surface of the movable stencil and removes excess solder paste. The movable stencil 206 moves to the back and over the surface of the stencil wiper by moving backward in the combination printer 200, and the movable stencil moves back into position by moving forward. This motion is the translation of the movable stencil 206 in the y-axis direction, although it is possible that translation of the movable stencil in the combination printer 200 may occur in the x-axis direction alternatively or additionally.

During the time in which the movable stencil 206 is cleaned by the stencil wiper, or substantially simultaneously, the vision inspection system 220 moves into a position over the surface of the circuit board 216 to perform an inspection task. The vision inspection system 220 moves in a forward and back motion by way of the vision gantry 222, and is restricted in its movements to a position over the circuit board 216 while the movable stencil 206 is being cleaned, since the movable stencil is moved toward the rear of the combination printer 200, thereby allowing a substantial space over the circuit board for the vision inspection system to inspect. Thus, wiping of the movable stencil 206 and inspection of the circuit board 216 may be accomplished in parallel.

Upon completion of inspection, the circuit board 216 exits the combination printer 200. The circuit board 216 can exit the combination printer 200 while the movable stencil 206 continues to be cleaned. The printing of a first circuit board 216 is thereby completed, and the circuit board can continue to a next manufacturing cycle. The combination printer 200 is prepared to accept a new circuit board 216, and a next print cycle can begin. While the next circuit board 216 moves into position in the combination printer 200, the stencil wipe process is completed and the movable stencil 206 moves towards the front of the combination printer to begin the printing cycle for the new circuit board.

In certain embodiments, the platform of the combination stencil printer and dispenser 200 shown and described with reference to FIG. 10 is described in detail in the following references: U.S. Pat. No. 7,013,802, entitled METHOD AND APPARATUS FOR SIMULTANEOUS INSPECTION AND CLEANING OF A STENCIL; U.S. Pat. No. 7,272,898, entitled METHOD AND APPARATUS FOR PERFORMING OPERATIONS WITHIN A STENCIL PRINTER; U.S. Pat. No. 7,322,288, entitled METHOD AND APPARATUS FOR PERFORMING OPERATIONS WITHIN A STENCIL PRINTER; and U.S. Pat. No. 7,469,635, entitled METHOD AND APPARATUS FOR PERFORMING OPERATIONS WITHIN A STENCIL PRINTER, all of which are assigned to Speedline Technologies, Inc. of Franklin, Mass., and incorporated herein by reference in their entirety for all purposes.

Still referring to FIG. 10, the combination printer 200 includes a dispenser, generally indicated at 230, to dispense viscous material on the circuit board 216 when the circuit board is in a dispense position. As shown, the dispenser 230 is secured or otherwise coupled to the stencil shuttle 218 of the movable stencil 206 and an x-axis movement mechanism, generally indicated at 232, is provided to move the dispenser back and forth in an x-axis direction with respect to a stencil shuttle. The construction of dispenser 230 and the x-axis movement mechanism 232 are substantially identical in construction to the construction of the dispenser 170 and x-axis movement mechanism 172. The dispenser 230 is movable in the x-axis direction by the x-axis drive mechanism 232, which includes a linear rail or bearing 234 that is mounted on the stencil shuttle 218. The dispenser 230 is configured to ride on the linear rail 234 to provide movement in the x-axis direction. In one embodiment, the controller 204 is configured to control the movement of the dispenser 230 in the x-axis direction by controlling the operation of the x-axis movement mechanism. Similarly, the controller 204 is configured to control the movement of the dispenser 230 in the y-axis direction by controlling the operation of the stencil shuttle 218.

In operation, the combination printer 200 is configured to perform a stencil print operation on a printed circuit board 216 when the movable stencil 206 is positioned over the circuit board. After printing, a dispense operation may also take place by using the dispenser 230 provided on the stencil shuttle 218. In one embodiment, a method of depositing viscous material on the circuit board 216 delivered to the combination printer 200 includes delivering the circuit board to the combination printer, positioning the circuit board in the print position, if required, moving the movable stencil 206 over the circuit board, performing a print operation on the circuit board with the dispensing head 210 and the movable stencil to deposit viscous material on the circuit board, and depositing viscous material on the circuit board with the dispenser 230, which is attached to the stencil shuttle 218. When positioning the circuit board 216 in the print position, and disposing the movable stencil 206 over the circuit board, the circuit board is aligned with the movable stencil. Once the printing and dispensing takes place, a bottom surface of the movable stencil 206 may be cleaned with the stencil wiper by moving the stencil over the stencil wiper.

Figure 11:
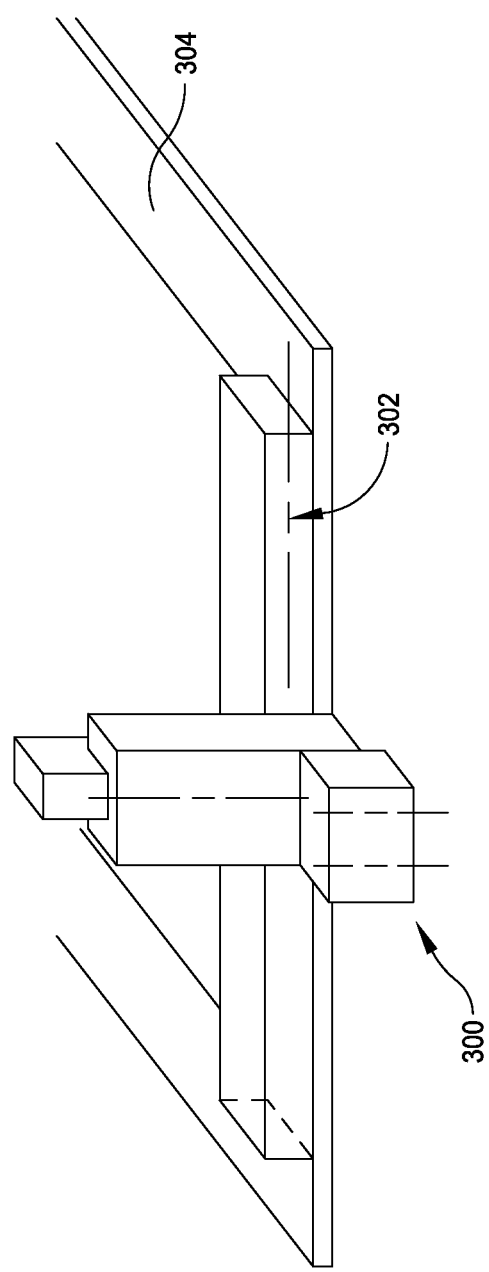
FIG. 11 is an enlarged perspective view showing a dispenser mounted on a movement mechanism.

In another embodiment, a method of depositing viscous material on a substrate delivered to the combination printer 200 includes positioning the circuit board 216 in the print position, performing a print operation on the circuit board with the dispensing head 210 and the movable stencil 206 to deposit viscous material on the circuit board, inspecting the circuit board with the vision inspection system 220 to detect a defect with the deposit of viscous material on the circuit board, and, in the event of a defect, re-working the substrate by depositing viscous material on the substrate with the dispenser 230 attached to the stencil shuttle 218 to correct the defect. FIG. 11 illustrates a dispenser, generally indicated at 300, coupled to an x-axis movement mechanism, generally indicated at 302, which in turn is secured to an independent gantry 304. In this embodiment, the independent gantry 304 may be provided in any type of stencil printer, including the ACCELA and MOMENTUM stencil printer platforms described above. The arrangement is such that the independent gantry 304 may be configured to move in the y-axis direction within the combination stencil printer and dispenser.

As used herein, "print position" identifies a position in which the circuit board is ready to be printed upon and/or dispensed upon. For combination printer 100, the print position is identified when the circuit board 112 is delivered to the support assembly 120 and a print operation can be performed on the circuit board. In this print position, a dispense operation with dispenser 170 may be performed as well. As such, the print position may be identified as the dispense position as well. For combination printer 200, the print position is identified when the circuit board 216 is delivered to the support assembly 212 and the movable stencil 206 is positioned over the circuit board. In this position, a print operation and a dispense operation with dispenser 232 may be performed on the circuit board 216.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. For example, the parameters described herein may be modified to accommodate different printing process requirements. Accordingly, the foregoing description and drawings are by way of example only.

What is claimed is:

1. A combination stencil printer and dispenser for depositing viscous material on a substrate, the combination stencil printer and dispenser comprising:
   a frame;
   a stencil coupled to the frame by a stencil shuttle configured to support and move the stencil in a first direction between a print position in which the stencil is located at one of a front and a back of the combination stencil printer and dispenser and a non-print position in which the stencil is located at the other of the front and the back of the combination stencil printer and dispenser;
   a substrate support coupled to the frame to support a substrate in a print position;
   a print head having a first dispenser coupled to the frame to deposit and print viscous material over the stencil, the print head being configured to move across the stencil; and
   a second dispenser directly attached to the stencil shuttle and moved by the stencil shuttle to dispense viscous material on the substrate when the substrate is in the print position.

2. The combination stencil printer and dispenser of claim 1, wherein the second dispenser includes a bracket mounted on the stencil shuttle, and a dispensing unit supported by the bracket.

3. The combination stencil printer and dispenser of claim 2, wherein the bracket of the second dispenser is coupled to a dispenser movement mechanism to move the second dispenser with respect to the stencil shuttle in a second direction that is perpendicular to the first direction.

4. The combination stencil printer and dispenser of claim 3, wherein the dispenser movement mechanism includes a linear bearing mounted on the stencil shuttle, the bracket being configured to ride along the linear bearing.

5. The combination stencil printer and dispenser of claim 4, wherein the dispenser movement mechanism further includes a ball screw coupled to the bracket and configured to drive the movement of the bracket along the linear bearing.

6. The combination stencil printer and dispenser of claim 5, wherein the dispenser movement mechanism further includes a motor coupled to the ball screw and configured to drive the rotation of the ball screw.

7. The combination stencil printer and dispenser of claim 2, wherein the second dispenser includes another dispensing unit supported by the bracket.

8. The combination stencil printer and dispenser of claim 1, wherein the second dispenser includes
   a mounting block coupled to the stencil shuttle,
   at least one dispensing unit supported by the mounting block and in fluid communication with at least one viscous material supply, the at least one dispensing unit having an auger screw configured to dispense viscous material delivered by the at least one viscous material supply, and
   at least one motor supported by the mounting block and coupled to the at least one dispensing unit.

9. The combination stencil printer and dispenser of claim 8, wherein the second dispenser further includes a sensor configured to detect a distance of the at least one dispensing unit to the substrate.

10. The combination stencil printer and dispenser of claim 1, wherein the stencil shuttle includes a pair of rail members secured to the frame and a drive mechanism coupled to the stencil shuttle.

11. The combination stencil printer and dispenser of claim 1, further comprising a cleaning assembly coupled to the frame to wipe excess viscous material from a bottom surface of the stencil.

12. The combination stencil printer and dispenser of claim 1, further comprising a controller to control the operation of the combination stencil printer and dispenser.

* * * * *